(12) United States Patent
Asbrock et al.

(10) Patent No.: US 7,206,062 B2
(45) Date of Patent: Apr. 17, 2007

(54) READOUT INTEGRATED CIRCUIT (ROIC) FOR LASER DETECTION AND RANGING (LADAR) SYSTEM AND METHOD FOR USING SAME

(75) Inventors: James F. Asbrock, Oceanside, CA (US); George W. Dietrich, Murphy, TX (US); Lloyd F. Linder, Agoura Hills, CA (US)

(73) Assignee: Raytheon Company, Waltham, MA (US)

( * ) Notice: Subject to any disclaimer, the term of this patent is extended or adjusted under 35 U.S.C. 154(b) by 52 days.

(21) Appl. No.: 11/108,921

(22) Filed: Apr. 18, 2005

(65) Prior Publication Data

US 2006/0232760 A1    Oct. 19, 2006

(51) Int. Cl.
*G01C 5/00* (2006.01)

(52) U.S. Cl. .................. 356/4.03; 356/4.01; 356/4.02; 356/4.04; 356/4.05

(58) Field of Classification Search ................ 356/4.03
See application file for complete search history.

(56) References Cited

U.S. PATENT DOCUMENTS

| | | | |
|---|---|---|---|
| 4,535,319 A | 8/1985 | Penney et al. | |
| 5,084,704 A | 1/1992 | Parrish | |
| 5,665,959 A * | 9/1997 | Fossum et al. | 250/208.1 |
| 5,726,742 A * | 3/1998 | Nourrcier | 356/5.01 |
| 6,094,153 A | 7/2000 | Runsey et al. | |
| 6,404,506 B1 | 6/2002 | Cheng et al. | |
| 2001/0048729 A1 | 12/2001 | Martin et al. | |
| 2004/0145721 A1 * | 7/2004 | Pain et al. | 356/4.01 |

FOREIGN PATENT DOCUMENTS

EP         1 434354 A      6/2004

* cited by examiner

*Primary Examiner*—Thomas H. Tarcza
*Assistant Examiner*—Luke D. Ratcliffe
(74) *Attorney, Agent, or Firm*—Leonard A. Alkov

(57) ABSTRACT

Disclosed is a LADAR system and a method for operating same. The LADAR system includes circuitry for generating the electrical signal with an optical signal detector using N discrete samples; a bank of M parallel sample/hold circuit unit cells individual ones of which operate with an associated sample/hold clock, where each sample/hold clock is shifted in time by a fixed or programmable amount $\Delta t$ relative to a sample/hold clock of an adjacent sample/hold circuit unit cell; and further includes circuitry for sequentially coupling a sampled value of the electrical signal from a first output of individual ones of at least some of the M parallel sample/hold circuit unit cells to an analog to digital converter circuit. Each of the M parallel sample/hold circuit unit cells has a second output for outputting a digital signal for indicating the state (low or high) during a time that the associated sample/hold clock allowing for time of arrival determination. The LADAR system further includes or is coupled to a signal processor for deriving an image of the object and a range to the object based on signals at the first and second outputs. Assuming an effective sample/hold circuit sampling rate of X samples per second, a sampling rate of each of the M parallel sample/hold circuit unit cells can be X/M samples per second.

23 Claims, 7 Drawing Sheets

READOUT INTEGRATED CIRCUIT (ROIC) FOR LASER DETECTION AND RANGING (LADAR) SYSTEM AND METHOD FOR USING SAME

STATEMENT OF GOVERNMENT RIGHTS

This invention was made with Government support under contract No.: DAAB07-00-C-L528 awarded by the Department of the Army. The Government has certain rights in this invention.

TECHNICAL FIELD

These teachings relate generally to detectors of optical signals and, more specifically, to readout electronic circuits for use with optical detectors in laser ranging and detection and other types of systems.

BACKGROUND

Object detection and ranging has traditionally been done by RADAR (Radio Detecting And Ranging) systems. Radar waves have a relatively long wavelength that creates a broad radar beam. In many detecting situations the broad beam covers the entire target, making it difficult to obtain target shape information. Thus, RADAR generally cannot accurately determine the shape of an object in those applications requiring target detection, recognition and identification.

In recent years, LADAR (Laser Detecting And Ranging) systems have been introduced. LADAR systems use laser beams, which have a short wavelength, in place of radio waves. The short wavelength laser beam provides a much narrower beam and higher power with which to illuminate the target. For example, the beam may be less than a meter in diameter. From these many measurements of range, the three dimensional shape of the target may be obtained, thereby allowing the target to be distinguished from non-targets (referred to as "clutter").

A LADAR system is an electro-optical system using a laser as an illuminator and a receiver which detects a return of the laser and converts the time taken for the return to a range value. Some LADAR systems are of the scanning variety and are referred to as scanning LADAR systems. In this type of LADAR, a laser is pulsed at a high rate with one pulse per pixel (picture element) or portion of the target area to be studied. The laser is scanned such that each pixel in the field of view (FOV) is illuminated and detected. Each laser pulse may be reflected from the target area and received by a detector at the LADAR site. The receiver has a collection aperture and a detector with an instantaneous field of view (IFOV) which corresponds to the portion of the target area which is illuminated by the laser beam. The receiver IFOV is less than the FOV and hence defines the pixel location within the FOV.

The detector and the laser are scanned congruently so that the detector is always positioned to receive any reflected laser beams from the most recent laser pulse. After the entire target area has been scanned, the LADAR system has enough information to determine the approximate range to any object within the target area and the approximate shape of any detected object. Since the LADAR system can be mobile and objects within the target area are often mobile, distortion is introduced into the scanning LADAR system model due to the relative movement of the laser source and the target object during the scan of the LADAR. These distortions are manifested in inaccurate range determinations and imprecise shapes. In addition, purely analog range processors, such as those used with scanning LADAR systems, are not as accurate as all digital or hybrid analog-digital range processors.

Flash LADAR systems have been introduced which solve the problems associated with scanning LADAR systems. Flash LADAR systems illuminate the entire target area with a single pulse from the laser. This laser pulse is then reflected from any object within the target area. Next, the reflected laser pulse is received and the object detected. A flash LADAR system typically uses many detectors arranged in a two dimensional detector array for recreating the target area and for effectively determining the range and approximate shape of any objects contained within the FOV. The range and shape information may be used to identify an object and to determine the location of the object.

General reference in this regard can be made to commonly assigned U.S. Pat. No. 6,392,747 B1, issued May 21, 2002, "Method and Device for Identifying an Object and Determining its Location", to John B. Allen and Kent McCormack, the disclosure of which is incorporated by reference herein in its entirety.

It is known when digitizing fast laser return pulses, e.g., those with less than one nanosecond (ns) resolution, to use a greater than one gigasample ($>10^9$) per second (GSPS) analog-to-digital converter (ADC) per detector array pixel. At present there are commercially available, high speed bipolar-based, 8–10 bit ADCs, with an on-chip sample/hold (S/H) function, that are capable of digitizing at these sample rates.

However, each pixel requires an individual ADC. Since the ADCs are individually packaged, an n-pixel array would require n separate ADC circuit packages or devices. Additionally, these ADCs typically dissipate 0.5 to 6 watts per device, or more, depending on the process technology used. As such, from a focal plane array (FPA) perspective, this approach is only feasible for small linear arrays of detectors.

Furthermore, the ADC data must be demultiplexed (DMUXed) down to a clock rate that is suitable for inputting into slower CMOS signal processors. For example, and considering an 8:1 DMUX function, the ADC data may be slowed to a 125 MHz clock rate, which is acceptable for a conventional CMOS processor. The DMUX function itself, however, represents at least a 3–6 watts power dissipation per ADC.

Based on the foregoing it may be appreciated that this approach requires a large amount of power, and thus inherently causes thermal problems, packaging problems (including packaging parasitic problems), as well cost and complexity problems. As such, severe operating and design constraints are placed on the required LADAR readout integrated circuits (ROICs).

For example, using this approach for a small (e.g., 10×10 detector array), the ADC and DMUX function for generating digital data suitable for processing by a conventional CMOS signal processor is on the order of 600–1200 watts. This figure does not take into account the power dissipated in required I/O circuitry between the DMUXed data and the CMOS signal processor, which can be about 150 watts. The total power, not including the CMOS processor, is then greater than about 750 watts, resulting in the occurrence of the foregoing problems.

By the use of evolving silicon germanium BICMOS process technologies the total required power might be reduced by maintaining the I/O on-chip, and scaling down the ADC and DMUX power. However, the maximum power saving may only approach about 50%, resulting in a required operating power that is excessive for any but relatively small linear detector arrays.

Also, due to the integration levels that are currently achievable, not all of the pixel array electronics can be integrated onto one chip, even for a relatively small 10×10 array. As a result, a multi-chip design is required, that in turn requires careful packaging to avoid parasitic problems resulting from the high operating frequencies.

It can thus be appreciated that a need exists to provide a practical solution to the requirement for increased pulse sampling and resolution in a LADAR system, without incurring the power, size, cost, and performance penalties associated with the conventional approaches.

SUMMARY OF THE PREFERRED EMBODIMENTS

The foregoing and other problems are overcome, and other advantages are realized, in accordance with the presently preferred embodiments of these teachings.

This invention provides a solution to the foregoing problems by meeting desired performance requirements with a LADAR system the exhibits reasonable power dissipation, a practical chip size, and the ability to utilize a low cost and well characterized CMOS solution (as opposed to requiring a silicon germanium bipolar process).

In accordance with the teachings of this invention multiple high speed samples of each return pulse are obtained, the samples are digitized and signal processing algorithms are performed on the samples to determine the peak intensity or amplitude of the return pulse waveform, as well as to determine whether multiple returns from one transmitted pulse are present for example, an object behind camouflage. The approach taken by this invention allows industry standard CMOS processes to be used, with low clock rates, conventional packaging, and significantly lower power dissipation than other known approaches.

One goal of this invention is to provide a LADAR system that exhibits one nanosecond or less of temporal range resolution, without the need for high frequency sample clocks, thereby enabling the power consumption to be reduced over the prior art approaches by a factor of about 50 to 100 times. Thus, the thermally-related problems that plague the prior art approaches are overcome.

Another goal of this invention is to enable a single chip solution to be realized, using a conventional attachment to the detector array, thereby alleviating packaging concerns and packaging-related parasitic problems. The invention also removes the requirement for advanced bipolar technology, and accommodates existing standard CMOS technology, thereby also reducing cost and complexity.

The invention employs a bank of parallel, isolated N sample/hold circuits (where N is the number of samples required per return pulse). The sample/hold circuits are driven by a low noise amplifier (LNA) from an optical detector in each pixel of a detector array (which may be a linear array of detector unit cells or a two-dimensional area-type array of detector unit cells). In the preferred embodiment, due at least n part to the fact that at high frequencies it is desirable to minimize parasitic coupling effects, the detector array interfaces to a LNA array, where each LNA may be indium bump bonded to the detector. The electrical signal output from each LNA is fanned out to on-chip electronics that are preferably located outside the detector array. The electronics that is external to the chip area designated for the LNA array contains the N sample/hold circuits per pixel. Each sample/hold circuit samples the pulse return at a different point in the return pulse waveform. The sampling points may be equally spaced apart, and the temporal separation between sampling points, referred to herein as $\Delta t$, may have a value of one nanosecond or less. Each sample/hold circuit transitions from the track to the hold mode separated by the time $\Delta t$, where the duration of $\Delta t$ can be determined using various techniques. For example, the duration of $\Delta t$ can be determined by passive RC networks, either with discrete resistor and/or capacitor components, or through the resistive and capacitive parasitics of a particular process technology, or it may be defined by a propagation delay through active circuitry, such as inverters. By using these means and other means for generating time delays, the sampling resolution can be made sub-nanosecond, and can guarantee that the sampling process is monotonic, even if there is a $\Delta t$ delay variation between the N sample/hold circuits.

Through this process of using a bank of M parallel sample/hold circuits, where M is a submultiple of N, $\Delta t$ sets the effective sample rate of the signal, and not the clock of each individual sample/hold circuit. Therefore, each sample/hold circuit can be operated with a much slower clock rate than the overall sampling rate (N/M+$\Delta t$) for the return pulse signal.

Once the return pulse has been sampled, the sampling process stops, and the samples are read out at a relatively slow clock rate (relative to the effective sampling rate) to be digitized by a relatively low speed ADC (again relative to the effective sampling rate).

The teachings of this invention thus provide a number of advantages over prior art techniques. First, the overall power dissipation can be reduced by a factor of 50 to 100 as compared to conventional direct sampling of the signal at the full clock rate using a high speed sample/hold circuit and a high speed ADC. Second, the reduced clock rates enable standard CMOS process technology to be used. This allows significant cost savings over the use of higher speed process technologies, such as silicon germanium bipolar technologies. Third, standard ROIC packaging techniques can be used, thereby significantly reducing the size and complexity of the resulting circuit assembly, as compared to other solutions. This also dramatically reduces the weight of the resulting packaged assembly, taking into account the reduced thermal considerations.

Disclosed is a LADAR system and a method for operating same. The LADAR system includes circuitry for generating the electrical signal with an optical signal detector; a bank of M parallel sample/hold circuit unit cells individual ones of which operate with an associated sample/hold clock, where each sample/hold clock is shifted in time by a fixed or programmable amount $\Delta t$ relative to a sample/hold clock of an adjacent sample/hold circuit unit cell; and further includes circuitry for sequentially coupling a sampled value of the electrical signal from a first output of individual ones of at least some of the M parallel sample/hold circuit unit cells to an analog to digital converter circuit. Each of the M parallel sample/hold circuit unit cells has a second output for outputting a digital signal for indicating a presence or absence of the electrical signal during a time that the associated sample/hold clock is present. The LADAR system further includes or is coupled to a signal processor for deriving an image of the object and a range to the object based on signals at the first and second outputs. Assuming an effective sample/hold circuit sampling rate of X samples per second, a sampling rate of each of the M parallel sample/hold circuit unit cells can be X/M samples per second.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

It is assumed that the electronics described below is constructed and operated in a differential mode in order to provide common mode rejection of single-ended noise that can degrade the integrity of the return pulse signal. While this approach will tend to increase the overall power consumption somewhat, the increase in power consumption is justified by the resultant increase in performance.

Figure 1:
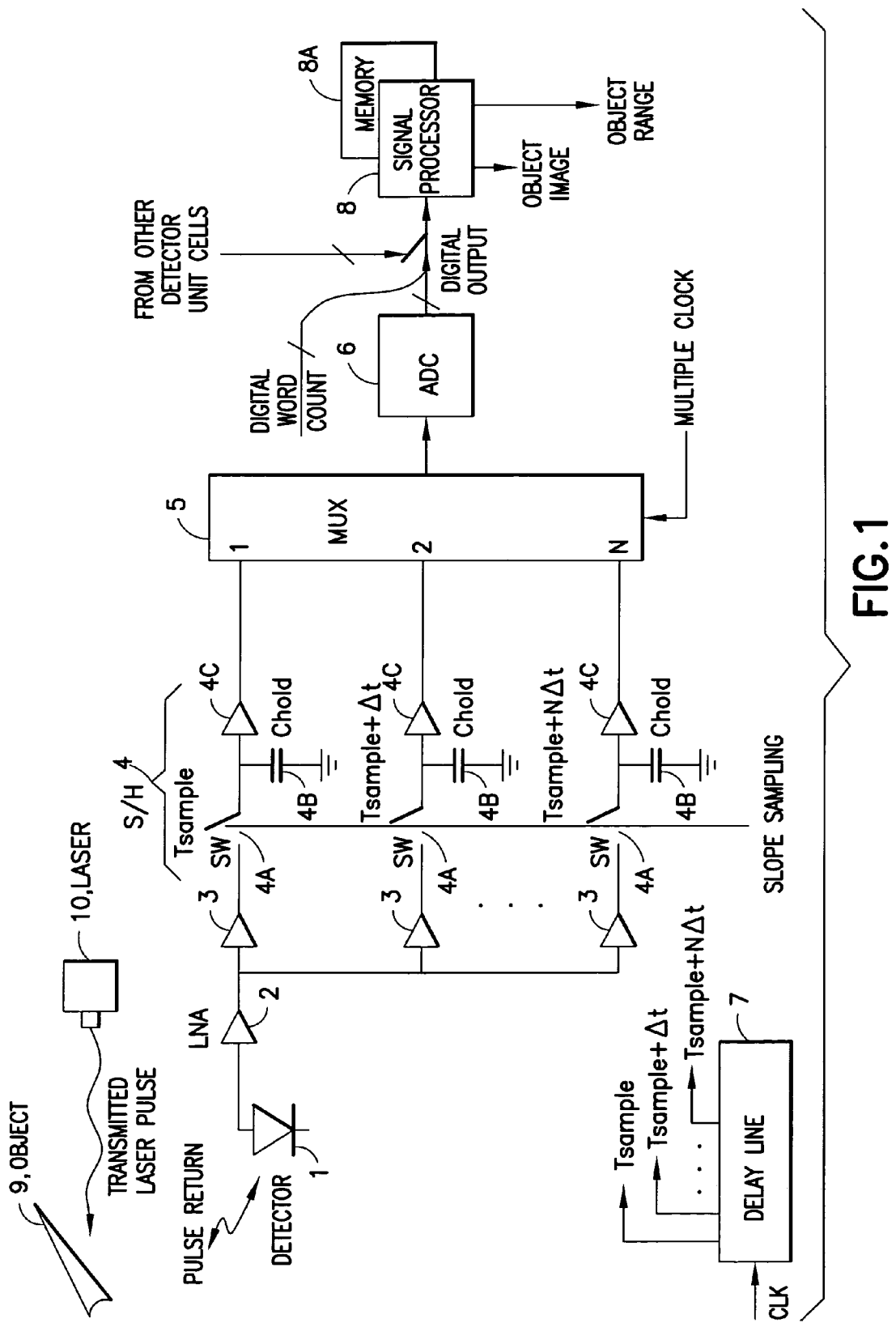
FIG. 1 is a simplified schematic diagram of unit cell readout circuit electronics in accordance with this invention that is constructed to include a parallel bank of N sample/hold circuits.

FIG. 1 shows a simplified schematic diagram of the improved unit cell readout electronics in accordance with this invention. Assuming the use of an IR source for the laser transmitter 10 (e.g., wavelength of 1.06 microns or 1.5 microns), an IR-responsive detector 1 (e.g., a solid state, Group II-VI detector such as one constructed from HgCdTe) has an output coupled to an input of a low noise amplifier (LNA) 2. The output of the LNA 2 is fanned-out via N buffers 3 in parallel to N sample/hold circuits 4. Each sample/hold circuit 4 includes a switch (SW) 4A, a hold capacitance 4B and an output buffer 4C. Each sample/hold circuit 4 is clocked at a significantly lower rate than the effective clock rate for each pixel.

Figure 2:
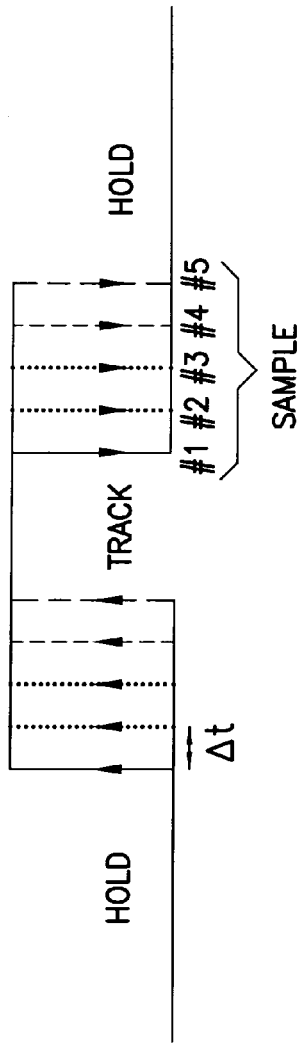
FIG. 2 is a waveform diagram showing sample/hold clock edge relationships and timing.

Tsample is the clock of the sample/hold circuit 4, and is used to open (falling edge) and close (rising edge) the sampling switch 4A. Each sample/hold circuit 4 is spaced in time from an adjacent sample/hold circuit by a time $\Delta t$, so that each sample/hold circuit 4 transitions from the track mode to the hold mode (sampling switch 4 opened) separated in time by the time $\Delta t$ relative to the previous sample/hold clock edge. The sample/hold timing is illustrated in FIG. 2 for a non-limiting example where N=5, and where each sample/hold clock edge is skewed by $\Delta t$ relative to the previous corresponding sample/hold clock edge. As a result, each sample/hold circuit 4 samples the return pulse, shown in FIG. 3, skewed in time by $\Delta t$ from adjacent sample/hold circuits.

In operation, once the return pulse signal is acquired, the sample/hold circuit 4 exits the sample mode and enters the hold mode, and thereafter holds the sampled signal until the sample is read out via a (slow) analog N:1 demultiplexer (DEMUX) 5, with sample/hold capability, to a (slow) ADC 6. For N samples, the minimum clock rate is determined by the fact that the return pulse signal must be properly acquired and held. After all of the samples are taken, the output MUX 5 reads out the held values to the slow ADC 6. A STOP SAMPLING command stops the sampling process.

The digitized output of the ADC 6 is input to a signal processor 8, along with a digital word time of arrival signal (described below in reference to FIGS. 7 and 8), in conjunction with corresponding output signals from other detector unit cells, to derive an image of, and a range to, the object 9.

Figure 3:
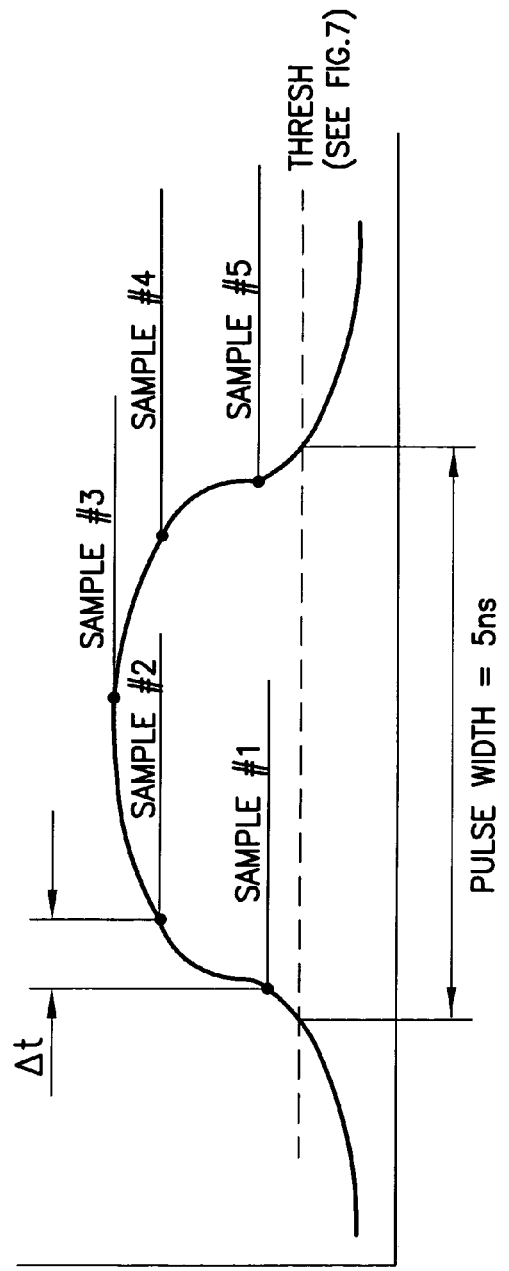
FIG. 3 shows the sampling of an exemplary five nanosecond return pulse using the sample/hold timing of FIG. 2.

FIG. 3 shows an exemplary five ns wide return pulse. For the non-limiting example where N=5, it can be seen that five samples of the return pulse signal are taken, with the samples being spaced apart in time by $\Delta t$, under control of the individual sample/hold clocks Tsample that are delayed as shown in FIG. 2. The delayed samples thus provide a 1 ns resolution, which translates to an effective one GSPS clock rate, but without the need to provide a high speed clock or high speed, high power dissipating circuitry.

Figure 4:
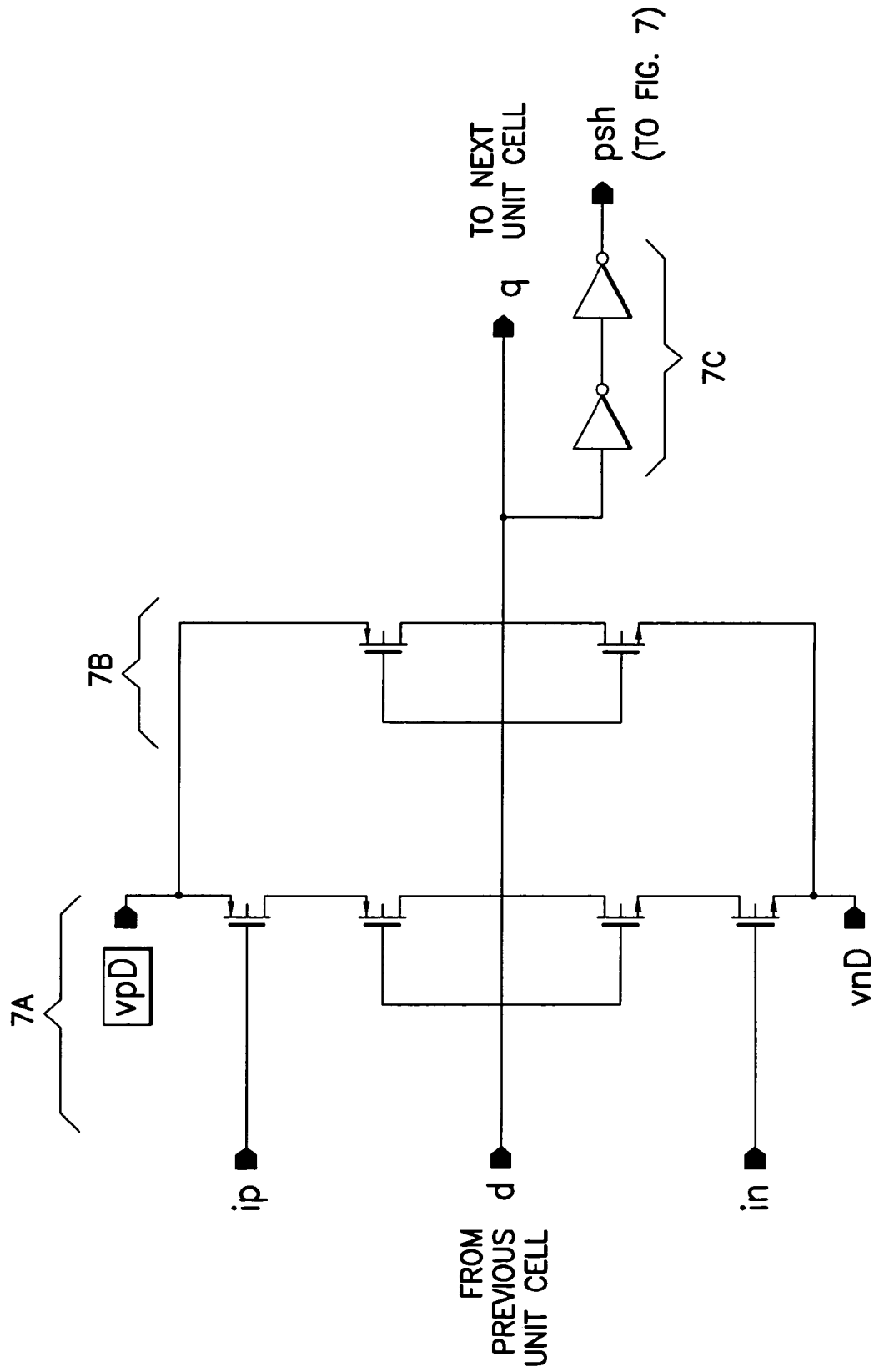
FIG. 4 is a schematic diagram of an embodiment of a delay line unit cell that is suitable for generating the sample/hold timing of FIG. 2, and that provides, as an example, a delay in the range of 0.2 to 5 nanoseconds.

The sample clock generator circuit used to set the delay $\Delta t$ of each sample clock edge is shown in FIG. 1 for convenience as a delay line 7. However, the circuit could also be thought of as a shift register. FIG. 4 illustrates a presently preferred embodiment of one unit cell of the sample clock generator 7. The sample clock generator 7 includes a current controlled inverter 7A (composed of four transistors connected between voltages vpD and vnD), followed by a normal inverter 7B and a buffer used to drive the sample/hold line (psh) to multiple unit cells. The input clock signal to be delayed (d), for other than the first unit cell of the chain, is obtained from the output (q) of the previous unit cell. Typically there will be a plurality of sample clock generators 7, such as one for every row (or columor pixel) of the detector array. The current through the input current sources of the current controlled inverter 7A is set via inputs ip and in as necessary to adjust the delay of each sample clock generator 7. The value(s) of the control currents are preferably, but not necessarily, programmable during the operation of the LADAR, enabling real-time control over the value of $\Delta t$ (e.g., in the range of about 0.2 to about 5 nanoseconds). For example, the signal processor 8, or some other data processor, can be employed to program the magnitude of the control currents for all or some of the unit cells of the sample clock generator 7, thereby changing the value of $\Delta t$.

Figure 5:
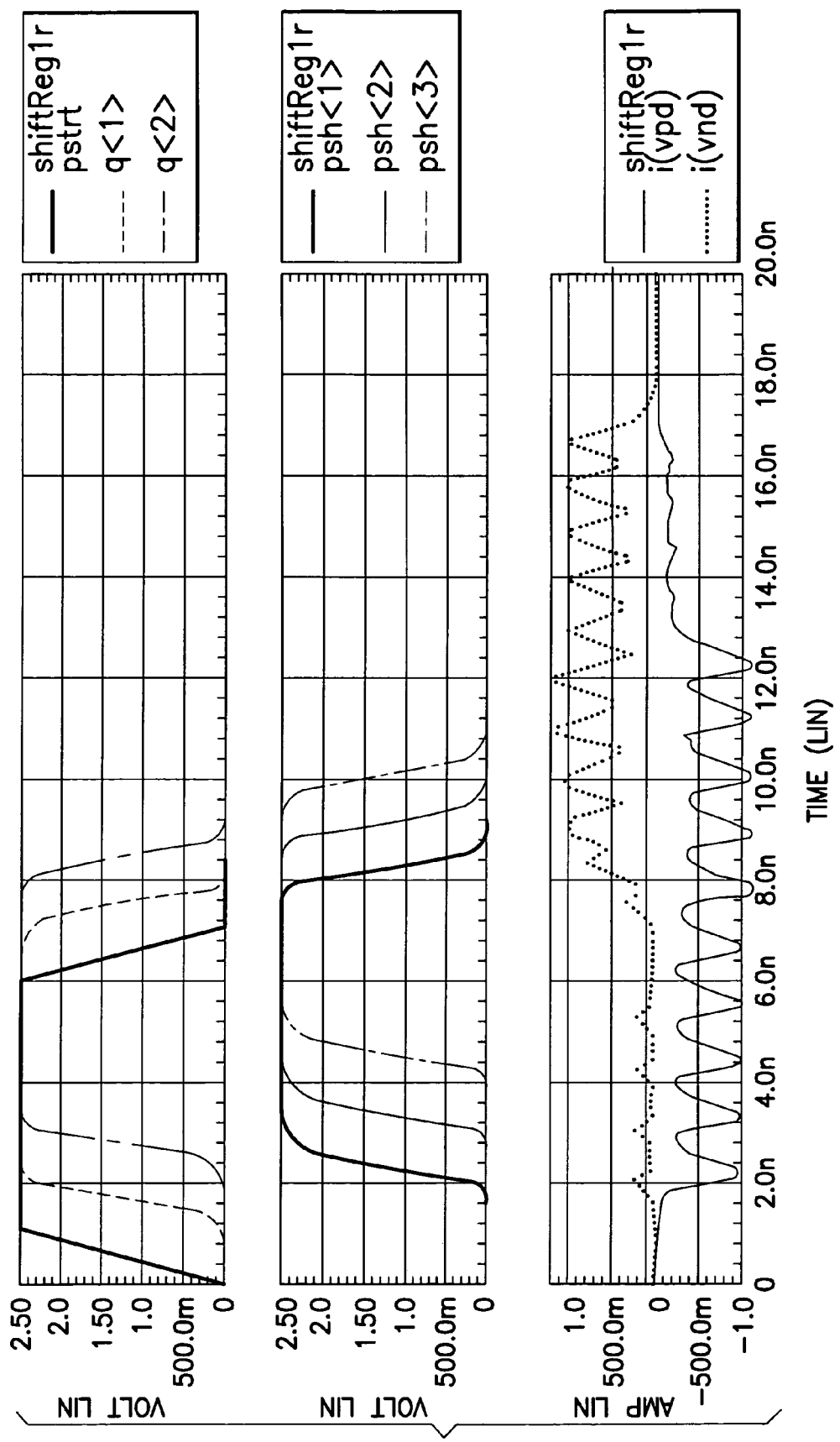
FIG. 5 is a more detailed waveform diagram that illustrates the first three sample/hold clocks output from the circuit of FIG. 4, assuming a one nanosecond delay between sample/hold clock edges and a five nanosecond return pulse width.

FIG. 5 illustrates the first three sample/hold clock pulses from the sample clock generator 7, where pstrt is the input signal to sample clock generator unit cells, and the delay of each cell is shifted by adjusting the current in the inverter 7A. The delayed output signals of the three unit cells are psh<1>, psh<2> and psh<3>.

Figure 6:
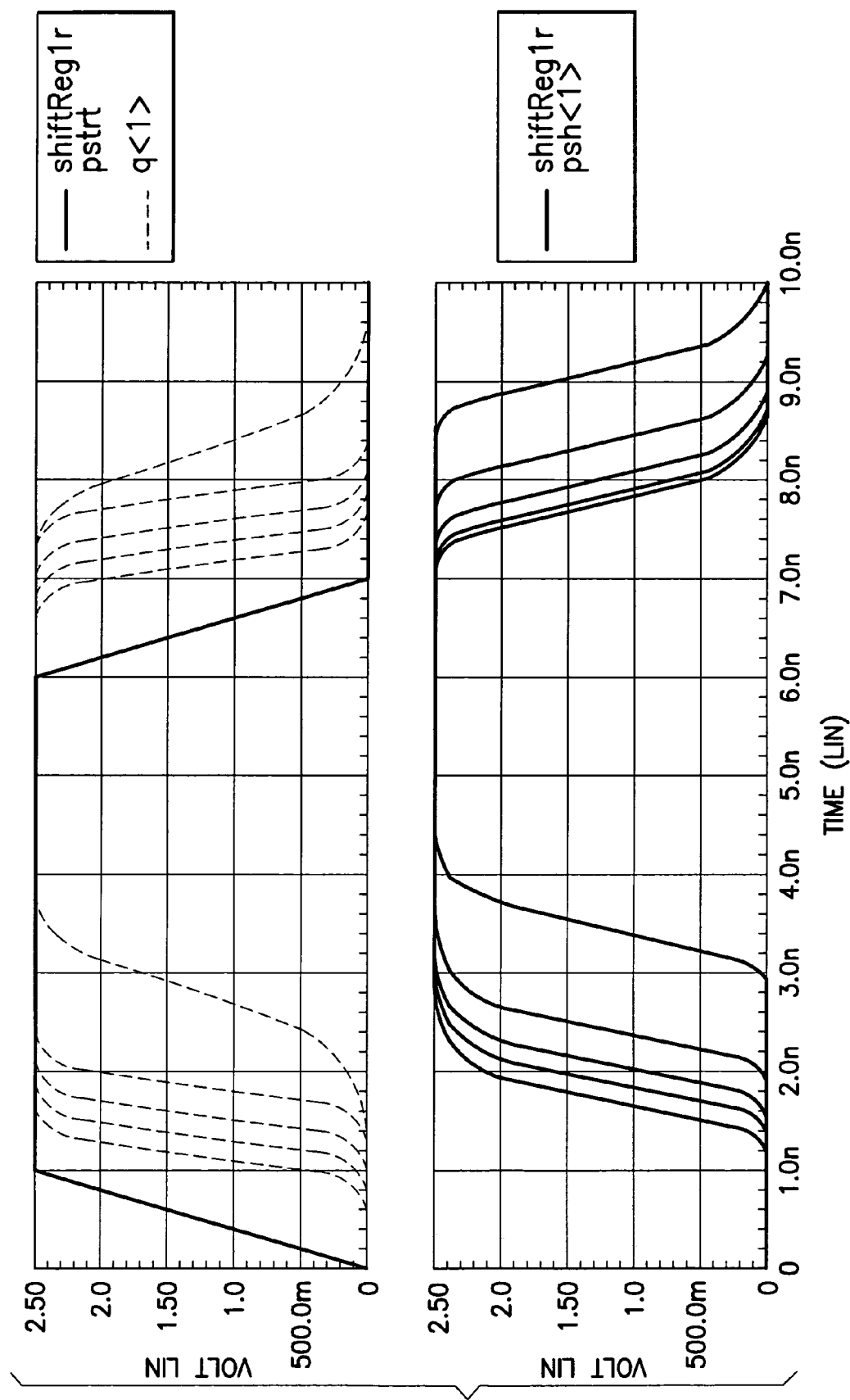
FIG. 6 illustrates the clock edge delay versus current control for the circuit of FIG. 4, assuming a three nanosecond delay that is achievable over a five microamp to 25 microamp current range.

FIG. 6 shows the analog control of the sample clock generator unit cell delay. As illustrated, there is a three nanosecond delay range using the adjustable current source 7A, where the current varies from 5 $\mu$A to 25 $\mu$A.

Figure 7:
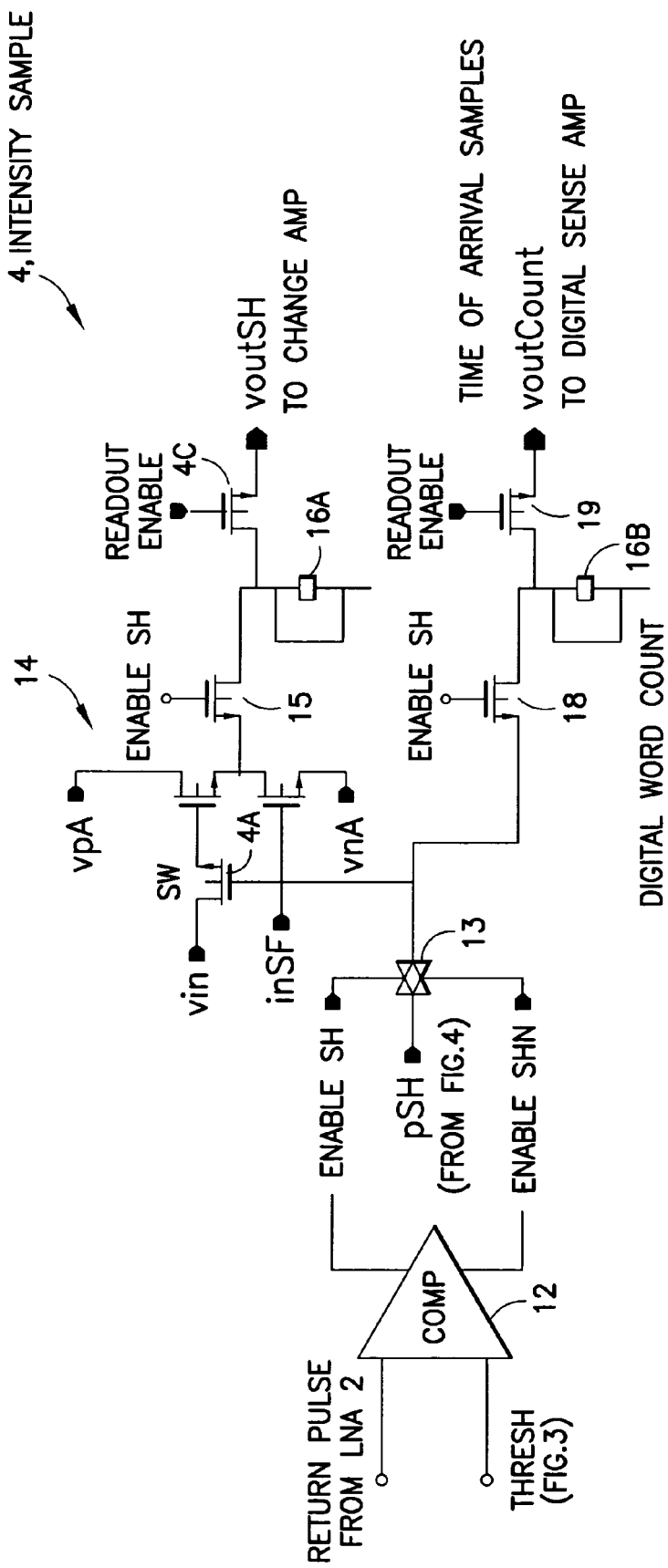
FIG. 7 is a schematic diagram of an embodiment of one sample/hold and counter circuit unit cell shown in FIG. 1.

FIG. 7 illustrates the construction of one sample/hold 4 unit cell. The clock signal that is used to sample the sampling clock is labeled enableSH. The sample and hold process is gated by an enable switch that is turned ON (enableSH) at the beginning of the detection cycle and turned OFF after a signal has been detected with a fixed delay. After the detection cycle, the charge on capacitors 16A and 16B is sensed and multiplexed off-chip. Sensing the analog voltage allows pulse recreation, including peak value and time, using digital signal processing techniques. Sensing the digital word allows the processor to determine at which one or ones of the N unit cells the sampling stopped. This count, together with the count from a slow counter that counts the number of start pulses, allows an accuracy of better than 1 nsec over a 32 nanosecond range time.

More specifically, in FIG. 7 a sample/hold clock pulse (psh, shown in FIGS. 5 and 6) and referred to as Tsample in FIG. 1) is used to gate, via buffer 13 and differential signals enableSH and enableSH output from a threshold detection comparator 12, the input signal vin to a buffer 14 and first sample/hold capacitor 16A, corresponding to Chold 4B in FIG. 1. The input signal vin is gated through a transistor switch that corresponds to the switch 4A of FIG. 1. The enableSH signal is also used to turn on transistor 15, enabling the gated vin to reach the sample/hold capacitor 16A. After the sampling period and after the start of the hold period a readout enable signal is used to transfer the stored charge on the sample/hold capacitor 16A, via an output buffer transistor corresponding to buffer 4C in FIG. 1, as output signal voutSH, to a charge amplifier (not shown) where a charge to voltage conversion occurs. This output signal is an analog output signal that is indicative of the intensity or magnitude of the return pulse signal at the sample time represented by psh, and can be used after being digitized by ADC 6 and signal processing to derive an image of the object 9 from which the return pulse has reflected. The application of the readout enabled signal sequentially to the bank of N parallel sample and hold unit cells 4 can perform the function of the multiplexer 5 shown in FIG. 1.

Als shown in FIG. 7 is a circuit used to sample/hold the value of the sampling clock psh onto a typically smaller capacitor 16B, via transistor switch 18 that is turned on with enableSH, and readout the held value as output signal voutCount through transistor 19 that is turned on with the read out enable signal. The output signal voutCount is provided to a digital sense amplifier used for detecting the presence of, and locate in time, the return pulse. This output signal is either a zero or a one, depending on whether the input signal to the comparator 12 is greater than the threshold set for return pulse detection at the time the psh clock occurs.

Figure 8:
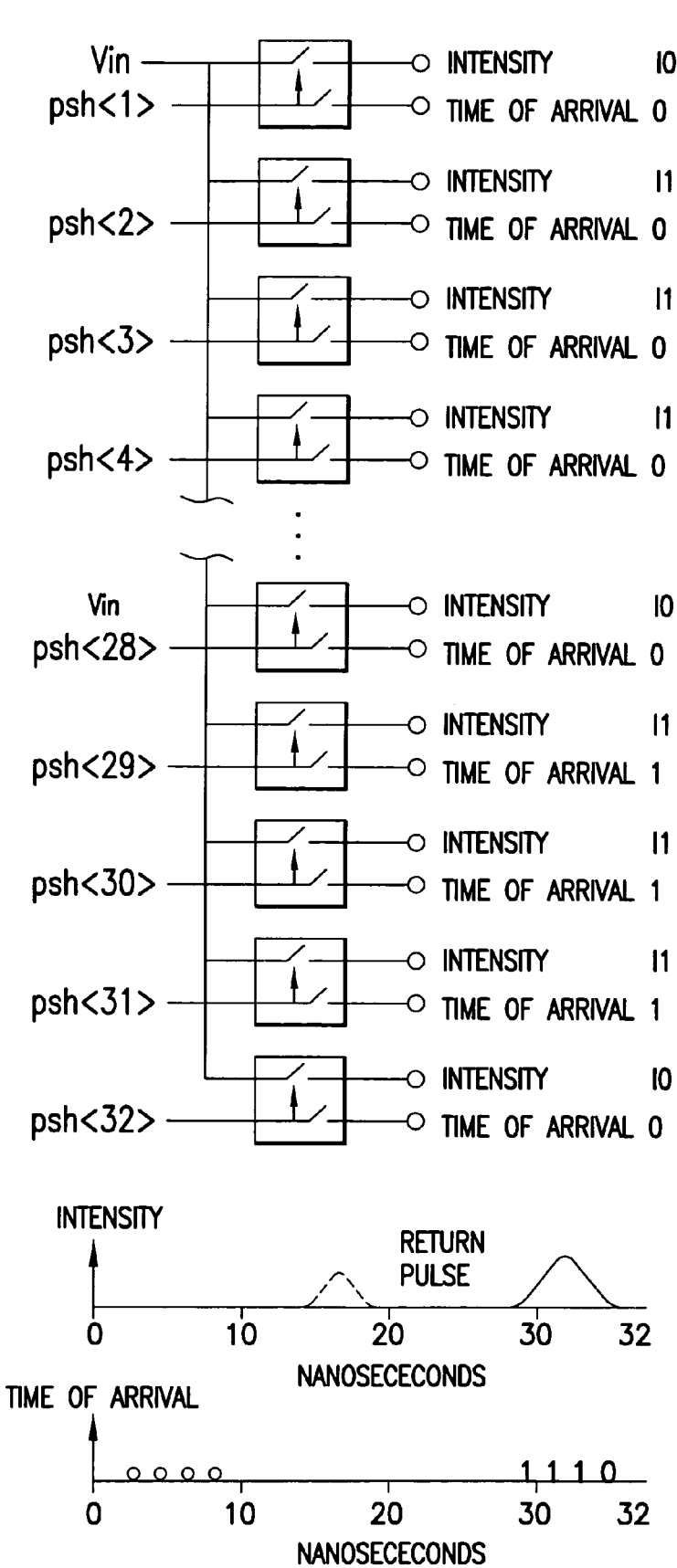
FIG. 8 illustrates an embodiment of 32 sample/hold unit cells and digital range-related outputs therefrom for an example of a return pulse that occurs at 29–31 nanoseconds.

As an example, and referring to FIG. 8, assume that N=32 and that there are 32 of the sample/hold unit cells 4 shown in FIG. 7 for each detector 1 unit cell. Also assume that the 32 psh sample clocks are spaced apart by one nanosecond, and that the transmitted laser pulse has a duration of five nanoseconds. In this case, and if the outputs of sample/hold unit cells 4 corresponding to psh<29>, psh<30> and psh<31> are ones, while the others are zeros, then the occurrence of the return pulse at this particular detector pixel is resolved in time to be from 29 nanoseconds to 31 nanoseconds from the start of the psh clock generator 7, which typically corresponds to the start of the optical pulse transmitted from the laser 10. Multiple return pulses from one transmitted laser pulse can be resolved in a similar manner, such as the one shown in dashed outline as occurring at time 15–18 nanoseconds. In combination with the return pulse amplitude information output from buffer 17 the digital signal processor 8 is enabled to characterize the object 9, and may generate a two or a three dimensional image of the object 9.

While described above in the context of electronic circuitry for use with a LADAR system, such as a flash LADAR system, those skilled in the art should recognize that at least certain aspects of these teachings may be applicable to other types of ranging and detection systems. Furthermore, the illustrated circuit embodiments are not to be construed in a limiting sense upon the practice of this invention. For example, so-called windowing techniques can be used to store the output data of the sample/hold circuits 4 in a memory 8A that is accessible to the signal processor 8, enabling a detected return signal pulse to be bracketed by detected data both prior to and following some desired point on the return signal pulse. Also by example, the active circuitry-based variable delay sample clock generator 7 shown in FIG. 4 may be replaced by a passive circuitry-based fixed delay sample clock generator that is constructed using, for example, lumped impedances and/or parasitic impedances. Alternatively, propagation delays through logic elements such as buffers can be used to establish the duration of $\Delta t$. It could also be produced by digital delay through a shift register although this requires more area and more power. Also, these techniques are not limited for use with sources and detectors of optical radiation in the IR spectrum. Furthermore, while the signal processor 8 may derive a range to the object 9 based on a digital word output from at least one of the M parallel sample/hold circuit unit cells 4, by using a plurality of the digital words output from a plurality of the detector unit cells to obtain ranges to different points on the same object 9, the signal processor 8 is enabled to derive a three dimensional image of the object 9, in cooperation with the corresponding intensity data output from the plurality of sample/hold circuit unit cells 4.

Thus, while the invention has been described in the context of presently preferred and exemplary embodiments thereof, these disclosed embodiments should not be construed in a limiting sense upon the practice of this invention.

What is claimed is:

1. Circuit apparatus for processing an electrical signal generated in response to detecting ma occurrence of an optical signal, comprising optical detector means comprising a plurality of detectors, each detector having an output for outputting the electrical signal to an input of a sample/hold circuit that has an output coupled to an analog to digitals converter circuit, said sample/hold circuit comprising a bank of M parallel sample/hold circuit unit cells individual ones of which operate with an associated sample/hold clock that is shifted in time by an amount $\Delta t$ relative to a sample/hold clock of an adjacent sample/hold circuit unit cell, further comprising readout means for sequentially coupling a sampled value of the electrical signal from a first output of individual ones of at least some of said M parallel sample/hold circuit unit cells to said analog to digital converter circuit.

2. Circuit apparatus as in claim 1, where each of said M parallel sample/hold circuit unit cells comprises a second output for outputting a digital signal for indicating time of arrival of the electrical signal during a time that the associated sample/hold clock is present.

3. Circuit apparatus as in claim 2, where digitized sampled values of the electrical signal are coupled to a signal processor to derive an image of the object, and where said digital signal is coupled to said signal processor to derive a range to the object.

4. Circuit apparatus as in claim 1, where said optical detector means comprises an array of infrared (IR) responsive solid state detectors.

5. Circuit apparatus as in claim 1, where said optical signal comprises a return pulse of optical energy that is reflected from an object in response to an optical transmitter, transmitting a pulse of optical energy.

6. Circuit apparatus as in claim 5, where said sample/hold circuit operates to sample the return pulse a plurality of times with a temporal spacing of $\Delta t$ between samples.

7. Circuit apparatus as in claim 6, further comprising a signal processor for deriving an image of the object based on outputs of a plurality of sample/hold circuits coupled to a plurality of detectors.

8. Circuit apparatus as in claim 2, where said optical signal comprises a return pulse of optical energy that is reflected from an object in response to an optical transmitter transmitting a transmitted pulse of optical energy, and where said digits signal that is output from each of said N parallel sample/hold circuit unit cells forms a digital word that is indicative of a time delay between a time when the optical transmitter transmits a pulse of optical energy and a time when the return pulse is detected.

9. Circuit apparatus as in claim 8, further comprising a signal processor for deriving a range to the object based on a digital word output from at least one of said M parallel sample/hold circuit unit cells.

10. Circuit apparatus as in claim 1, where an effective sample/hold circuit sampling rate is X samples per second, and where a sampling rate of each of said M parallel sample/hold circuit unit cells is X/M samples per second.

11. A method for processing an electrical signal generated in response to detecting an occurrence of an optical signal, comprising:

generating the electrical signal with an optical signal detector;

sampling and holding the electrical signal in a bank of M parallel sample/hold circuit unit cells individual ones of which operate with an associated sample/hold clock, where each sample/hold clock is shifted in time by an amount $\Delta t$ relative to a sample/hold clock of an adjacent sample/hold circuit unit cell; and sequentially coupling a sampled value of the electrical signal from a first output of individual ones of at least some of said M parallel sample/hold circuit unit cells to an analog to digital converter circuit.

12. A method as in claim 11, where each of said M parallel sample/hold circuit unit cells comprises a second output for outputting a digital signal for indicating a presence or absence of the electrical signal during a time that the associated sample/hold clock is present.

13. A method as in claim 12, further comprising deriving an image of the object and a range to the object based on signals at said first and second outputs.

14. A method as in claim 11, where said optical signal detector comprises an array of infrared (IR) responsive solid state detectors.

15. A method as in claim 11, where said optical signal comprises a return pulse of optical energy that is reflected from an object in response to an optical transmitter transmitting a pulse of optical energy.

16. A method as in claim 15, where said step of sampling and holding operates to sample the return pulse a plurality of times with a temporal spacing of $\Delta t$ between samples.

17. A method as in claim 16, further comprising deriving an image of the object based on outputs of a plurality of sample/hold circuits coupled to a plurality of optical signal detectors.

18. A method as in claim 12, where said optical signal comprises a return pulse of optical energy that is reflected from an object in response to an optical transmitter transmitting a transmitted pulse of optical energy, and further comprising forming a digital word with said digital signal that is output from each of said N parallel sample/hold circuit unit cells, said digital ward for indicating a time delay between a time when the optical transmitter transmits a pulse of optical energy and a time when the return pulse is detected.

19. A method as in claim 18, further comprising deriving a range to the object based on a digital word output from at least one of said N parallel sample/hold circuit unit cells.

20. A method as in claim 11, where an effective sample/hold circuit sampling rate is X samples per second, and where a sampling rate of each of said M parallel sample/hold circuit unit cells is X/M samples per second.

21. A LADAR system comprising means for processing an electrical signal generated in response to detecting an occurrence of a return optical signal pulse, said processing means comprising means for generating the electrical signal with an optical signal detector; means for sampling and holding the electrical signal comprising a bank of N parallel sample/hold circuit unit cells individual ones of which operate with an associated sample/hold clock, where each sample/hold clock is shifted in time by an amount $\Delta t$ relative to a sample/hold clock of an adjacent sample/hold circuit unit cell; means for sequentially coupling a sampled value of the electrical signal from a first output of individual ones of at least same of said N parallel sample/hold circuit unit cells to an analog to digital converter circuit, where each of said N parallel sample/hold circuit unit cells comprises a second output far outputting a digital signal for indicating a presence or absence of the electrical signal during a time that the associated sample/hold clock is present; and further comprising means for deriving an image of the object and a range to the object based on signals at said first and second outputs, where an effective sample/hold circuit sampling rate is X samples per second, and where a sampling rate of each of said M parallel sample/hold circuit unit cells is X/M samples per second.

22. A LADAR system as in claim 21, where said sampling and holding means operates to sample the return optical signal pulse a plurality of times with a temporal spacing of $\Delta t$ between samples.

23. A LADAR system as in claim 22, where $\Delta t$ is programmable during operation of said LADAR system.

* * * * *